United States Patent
Cheng et al.

(10) Patent No.: US 9,989,821 B2
(45) Date of Patent: Jun. 5, 2018

(54) DISPLAY SUBSTRATE STRUCTURE

(71) Applicant: AU Optronics Corp., Hsin-Chu (TW)

(72) Inventors: Keng-Chuan Cheng, Hsin-Chu (TW); Chien-Hao Fu, Hsin-Chu (TW); Chien-Ju Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 806 days.

(21) Appl. No.: 14/602,286

(22) Filed: Jan. 22, 2015

(65) Prior Publication Data
US 2015/0216045 A1 Jul. 30, 2015

(30) Foreign Application Priority Data
Jan. 28, 2014 (TW) .............................. 103103240 A (51) Int. Cl.
- *H05K 1/16* (2006.01)
- *G02F 1/1345* (2006.01)
- *H05K 1/02* (2006.01)
- *G02F 1/1337* (2006.01)

(52) U.S. Cl.
CPC .... *G02F 1/13452* (2013.01); *G02F 1/133784* (2013.01); *H05K 1/0289* (2013.01)

(58) Field of Classification Search
CPC ........ H05K 1/0296; H05K 1/111; H05K 1/11; H05K 1/115; H05K 1/0281; H05K 1/0271; H05K 1/0289; G02F 1/13; G02F 1/13452; G02F 1/1345; G02F 1/133784; H01L 23/48; H01L 27/3288; H01L 23/481; H01L 23/482; H01L 27/3297

USPC ....... 174/267, 254, 260, 255, 257, 549, 250, 174/261; 349/152, 56, 139, 149
See application file for complete search history.

(56) References Cited

U.S. PATENT DOCUMENTS

| | | | | |
|---|---|---|---|---|
| 6,822,164 B2 * | 11/2004 | Tsuji | ................... | G02F 1/13452 174/549 |
| 7,349,054 B2 * | 3/2008 | Kohtaka | ............. | G02F 1/13452 174/257 |
| 7,692,376 B2 * | 4/2010 | Lifka | .................. | H01L 27/3288 174/255 |

(Continued)

FOREIGN PATENT DOCUMENTS

| | | |
|---|---|---|
| CN | 1892322 A | 1/2007 |
| CN | 101673003 A | 3/2010 |
| TW | 201120508 | 6/2011 |

*Primary Examiner* — Angel R Estrada
(74) *Attorney, Agent, or Firm* — Tim Tingkang Xia, Esq.; Locke Lord LLP (57) ABSTRACT

A display substrate structure includes a substrate, at least one chip, and a plurality of conductive lines. A display region and a periphery region are defined on the substrate. The periphery region is disposed around the display region, and the chip is disposed in the periphery region. The conductive lines are disposed in the periphery region and at least between the chip and the display region. Each conductive line has a fan-out portion and at least one adjustment portion. Each adjustment portion is electrically connected to the fan-out portion of the same conductive line. The adjustment portion of each conductive line has a winding wire, and at least one of the adjustment portions of the conductive lines has a straight wire, which is electrically connected to and at least partially overlaps the winding wire of the same conductive line.

15 Claims, 7 Drawing Sheets

(56) References Cited

U.S. PATENT DOCUMENTS

| | | | | |
|---|---|---|---|---|
| 8,101,869 B2* | 1/2012 | Kurasawa | ............ | H05K 1/0281 |
| | | | | 174/260 |
| 8,228,677 B2* | 7/2012 | Kunimatsu | ............ | H05K 1/111 |
| | | | | 174/254 |
| 8,466,374 B2* | 6/2013 | Tsang | ................... | H05K 1/0271 |
| | | | | 174/267 |
| 8,582,068 B2* | 11/2013 | Kawamura | ............ | G02F 1/1345 |
| | | | | 349/152 |
| 2007/0002243 A1 | 1/2007 | Kim | | |
| 2011/0075089 A1 | 3/2011 | Jheng | | |

\* cited by examiner

DISPLAY SUBSTRATE STRUCTURE

BACKGROUND OF THE INVENTION

1. Field of the Invention

The present invention relates to a substrate structure, and more particularly, to a substrate structure used in display devices.

2. Description of the Prior Art

A flat panel display device has the characteristics of light weight and thin thickness, and it has gradually become the mainstream product in the market of display devices. It has been applied to home televisions, personal computer displays such as cellular phones, digital cameras, portable music players, and other portable electronic devices. Generally, the design of most of the flat panel displays is to dispose the electronic components or the light emitting elements on a thin substrate. Taking the thin film transistor (TFT) liquid crystal display as an example, it usually has two substrates: an upper substrate and a lower substrate. Wherein, TFTs, scan lines, signal lines, and pixel electrodes are disposed on the surface of the lower substrate, and color filters and some other components are disposed on the upper substrate. By using sealant to fix the position of the upper and lower substrates and filling the space between the two substrates with liquid crystal molecules, a TFT liquid crystal display is constructed. In addition, a TFT liquid crystal display usually includes a plurality of chips that control the switch of each pixel of the display by electrically connecting the scan lines, the signal lines, and other conductive lines. However, in order to meet the layout design of the signal lines and the scan lines, the conductive lines connected to the chips usually have different wire length, which brings uneven resistance of each wire and furthermore affects the speed and quality of the signal transmission of the signal lines and the scan lines. In the prior art, it is suggested to uniform the wire resistance by designing wires with different winding shapes, winding numbers, or other wire configurations. However, these designs may cause large variety of the wire configuration shapes in the peripheral region and cause uneven display when rubbing other film materials on the wires in the later processes, called as "rubbing mura".

SUMMARY OF THE INVENTION

One of the objectives of the present invention is to provide a display substrate structure that has relatively even configuration of wires in its peripheral region and uniform resistance as well.

To achieve the above objective, the present invention provides a display substrate structure that includes a substrate, at least one chip, and a plurality of conductive lines. A display region and a peripheral region are defined on the surface of the substrate. The peripheral region is disposed around the display region, and the chip is disposed in the peripheral region. The conductive lines are at least disposed in the peripheral region and at least disposed between the chip and the display region. Each conductive line includes a fan-out portion and at least one adjustment portion. The fan-out portion of each conductive line is electrically connected to the chip, and the adjustment portion of each conductive line is electrically connected to the fan-out portion of the same conductive line. The adjustment portion of each conductive line includes a winding wire. At least one of the adjustment portions of these conductive lines has a straight wire. Furthermore, the straight wire and the winding wire of the same conductive line at least partially overlap and are electrically connected to each other.

Because the adjustment portion of each of the conductive lines in the peripheral region of the present invention has a winding wire, all the adjustment portions of the conductive lines have uniform and even configurations to improve the problem of rubbing mura mentioned above. Moreover, the present invention further provides the adjustment portion of the conductive line that may include a straight wire electrically connected to the winding wire. By the disposition of the straight wire, the resistance of the conductive line can be reduced so as to further achieve the objective of adjusting and uniforming the resistance of each conductive line.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
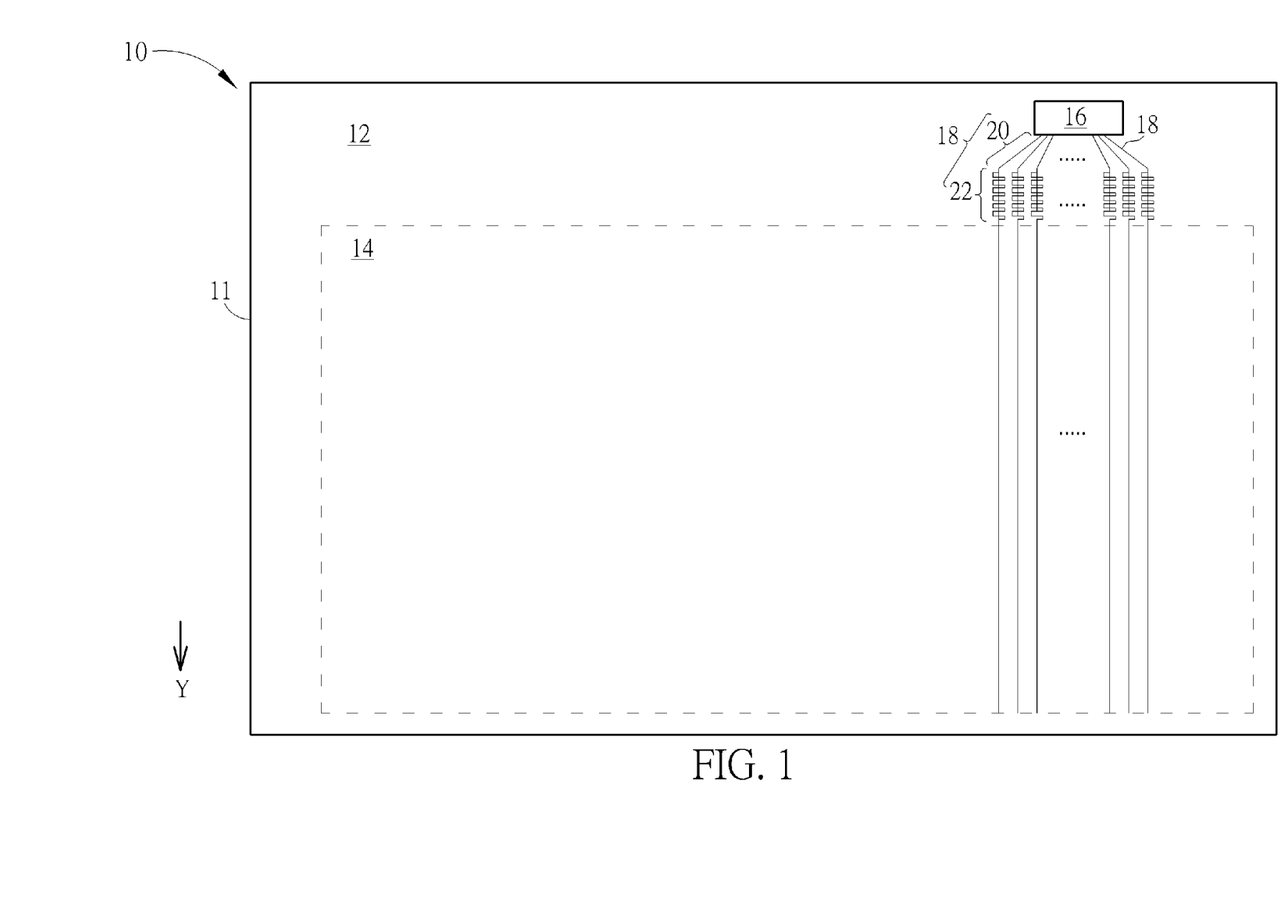
FIG. 1 is a schematic diagram of the top view of a display substrate structure according to the first embodiment of the present invention.
Figure 2:
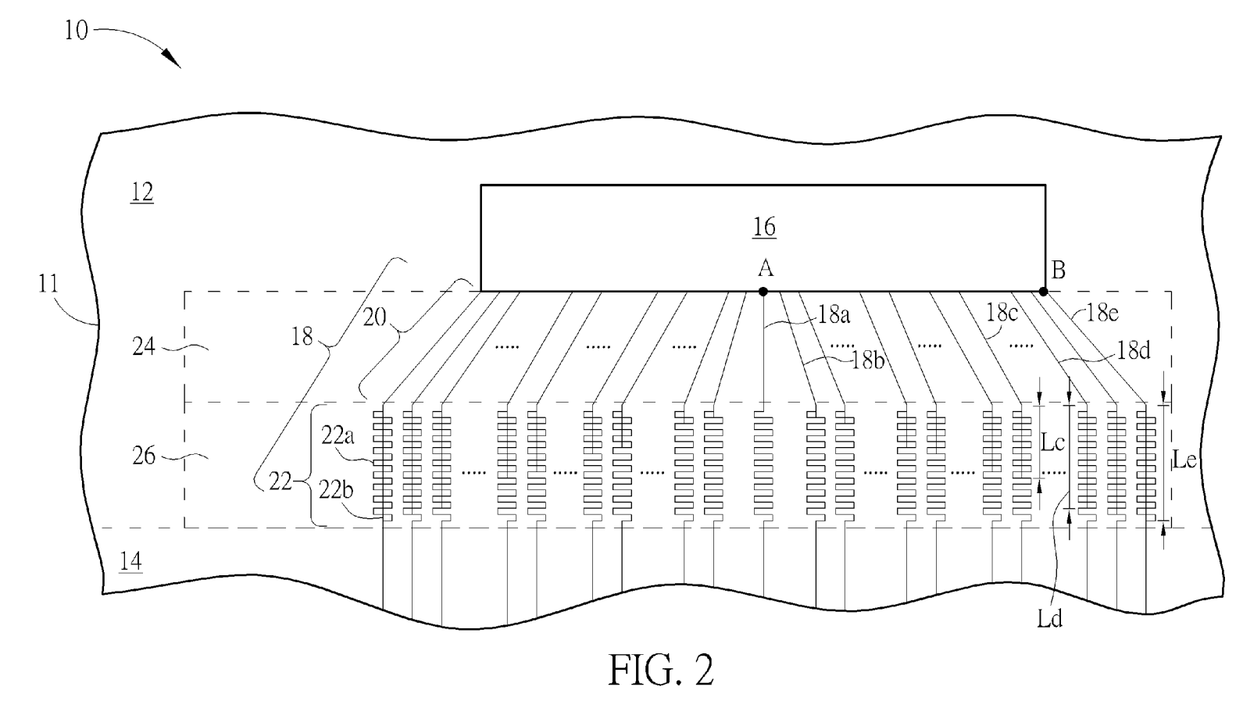
FIG. 2 is a partially enlarged schematic diagram of the display substrate structure shown in FIG. 1.

Referring to FIG. 1 and FIG. 2, FIG. 1 is a schematic diagram of the top view of a display substrate structure according to the first embodiment of the present invention, and FIG. 2 is a partially enlarged schematic diagram of a display substrate structure shown in FIG. 1. The display substrate structure 10 of the present invention is applied to a display device, such as a TFT liquid crystal display panel of a flat display device, but not limited thereto. The display substrate structure 10 includes a substrate 11, at least one chip 16, and a plurality of conductive lines 18. As an example, the substrate 11 is a glass substrate, but not limited thereto. A peripheral region 12 and a display region 14 are defined on the surface of the substrate 11, wherein the peripheral region 12 is disposed around the display region 14. The chip 16 is disposed on the substrate 11 and in the peripheral region 12. For example, in FIG. 1, the chip 16 is disposed on the upper side of the display region 14. The chip 16 in this embodiment, for example, is an integrated circuit (IC) chip. The conductive lines 18 are electrically connected to the chip 16 and are at least disposed between the chip 16 and the display region 14. In FIG. 1, each conductive line 18 substantially extends from the chip 16 along the Y direction toward the display region 14 to be arranged in the display region 14. In the preferred embodiments, the conductive lines 18 also extend along the Y direction continually in the display region 14, but not limited thereto. In addition, in other embodiments, there may be a plurality of chips 16 disposed on the surface of the display substrate structure 10. For example, the chips 16 may be disposed on top of or on the sides of the display region 14, and conductive lines 18 are disposed between each chip 16 and the display region 14. Moreover, the conductive lines 18 in this embodiment may be used as the source lines, gate lines, other signal lines, or other functional conductive lines of the display device.

As shown in FIG. 2, the partially enlarged schematic diagram of the chip 16 and the conductive lines 16 illustrates that the space between the chip 16 and the display region 14 is divided into a fan-out area 24 and an adjustment area 26. Each conductive line 18 respectively includes a fan-out portion 20 and an adjustment portion 22 respectively disposed in the fan-out area 24 and the adjustment area 26. The fan-out portion 20 of each conductive line 18 is electrically connected to the chip 16. These fan-out portions 20 are arranged in a fan-out shape in the fan-out area 24. Therefore, in the fan-out area 24, the length of the fan-out portion 20 of each conductive line 18 is various. For example, the closer the fan-out portion 20 to the outer side of the chip 16 is, the longer it is. Moreover, the adjustment portion 22 of each conductive line 18 is electrically connected to the display region 14 and respectively electrically connected to the fan-out portion 20 of the same conductive line 18. It means that the adjustment portion 22 of each conductive line 18 is disposed between its fan-out portion 20 and the display region 14. The adjustment portions 22 respectively include a winding wire 22a. Wherein each winding wire 22a has a pattern with S shapes or saw-toothed shapes which are evenly and continuously arranged, but not limited thereto. In FIG. 2, the winding wires 22a including evenly and continuously disposed saw-toothed shapes are illustrated as an example. In the preferred embodiments of the present invention, all the wiring wires 22a of the conductive lines 18 have the identical patterns. In addition, at least one of the adjustment portions 22 of these conductive lines 18 includes a straight wire 22b, and the straight wire 22b and the winding wire 22a of the same conductive line 18 at least partially overlap and are electrically connected to each other. In FIG. 2, more than two adjustment portions 22 of the conductive lines 18 have a straight wire 22b respectively, and the lengths of these straight wires 22b are not exactly the same. It means that at least two straight wires 22b of the conductive lines 18 have different lengths. For the conductive lines 18 which have both the straight wire 22b and the winding wire 22a, the resistance of its adjustment portion 22 is determined by the length of its straight wire 22b passing through the corresponding winding wire 22a. The longer the straight wire 22b is, the smaller the resistance of the adjustment portion 22 of the conductive line 18 is. Therefore, although all the adjustment portions 22 have the winding wires 22a with the identical pattern, the resistance of the adjustment portion 22 of each conductive line 18 can be adjusted by adjusting the straight wires 22b with different lengths for the different conductive lines 18, in order to balance the resistance of the entire conductive line 18. For example, when the resistance of the fan-out portion 20 of a conductive line 18 is relatively large, the length of the straight wire 22b of this conductive line 18 can be designed to be longer than the length of the straight wire 22b of another conductive line 18 with a fan-out portion 20 having relatively small resistance.

Because the conductive lines 18 in the fan-out area 24 are arranged as a fan-out shape, the conductive lines 18 closer to the two sides of the chip 16 have longer fan-out portions 20 and accordingly have greater resistance in their fan-out portions 20. For example, taking the center of the chip 16 as the first datum point A and the outer side or one of the two ends of the chip 16 as the second datum point B, the conductive line 18a, the conductive line 18b, the conductive line 18c, the conductive line 18d, and the conductive line 18e are arranged from the first datum point A to the second datum point B in order. Therefore, the resistance of the fan-out portion 20 of the conductive line 18e which is closer to the second datum point B is greater than the resistance of the fan-out portion 20 of the conductive line 18d. To balance the entire resistance of each conductive line 18 in the peripheral region 12, the conductive line 18 closer to the second datum point B or the outer sides of the chip 16 should have a relatively longer straight wire 22b. For example, the length Le of the straight wire 22b of the conductive line 18e is greater than the length Ld of the straight wire 22b of the conductive line 18d, and the length Ld of the straight wire 22b of the conductive line 18d is greater than the length Lc of the straight wire 22b of the conductive line 18c. In addition, as shown in FIG. 2, the fan-out portion 20 of the conductive line 18a disposed at the first datum point A or in the center of the chip 16 has the shortest length. Therefore, its adjustment portion 22 may only have the winding wire 22a but not the straight wire 22b to make the resistance of the adjustment portion 22 of the conductive line 18a greater than the other conductive lines 18 with straight wires 22b, such as the conductive lines 18b、18c、18d、18e. It is noted that the present invention is not limited to the design in FIG. 2. In this embodiment of the present invention, it is introduced that the length of the straight wire 22b of the adjustment portion 22 is designed based on the resistance or length of the fan-out portion 20, which means that when the conductive line 18 has a higher resistance in its fan-out portion 20, its adjustment portion 22 should has a longer straight wire 22b. However, the resistance of the other parts of each conductive line 18 on the substrate 11 may also be considered according to the spirit of the present invention. When the conductive lines 18 have uneven resistances due to other factors on the substrate 11, the length of the straight wires 22b can be used to uniform the resistance of each conductive line 18.

Figure 3:
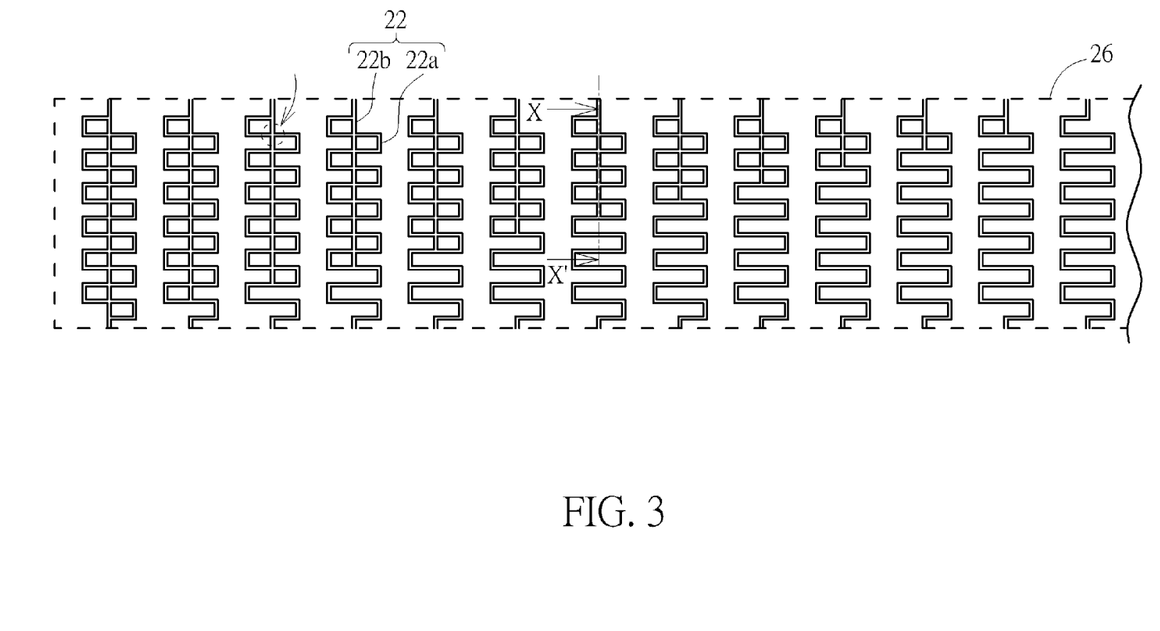
FIG. 3 is a partially enlarged schematic diagram of the adjustment region of the display substrate structure according to the first embodiment of the present invention.
Figure 4:
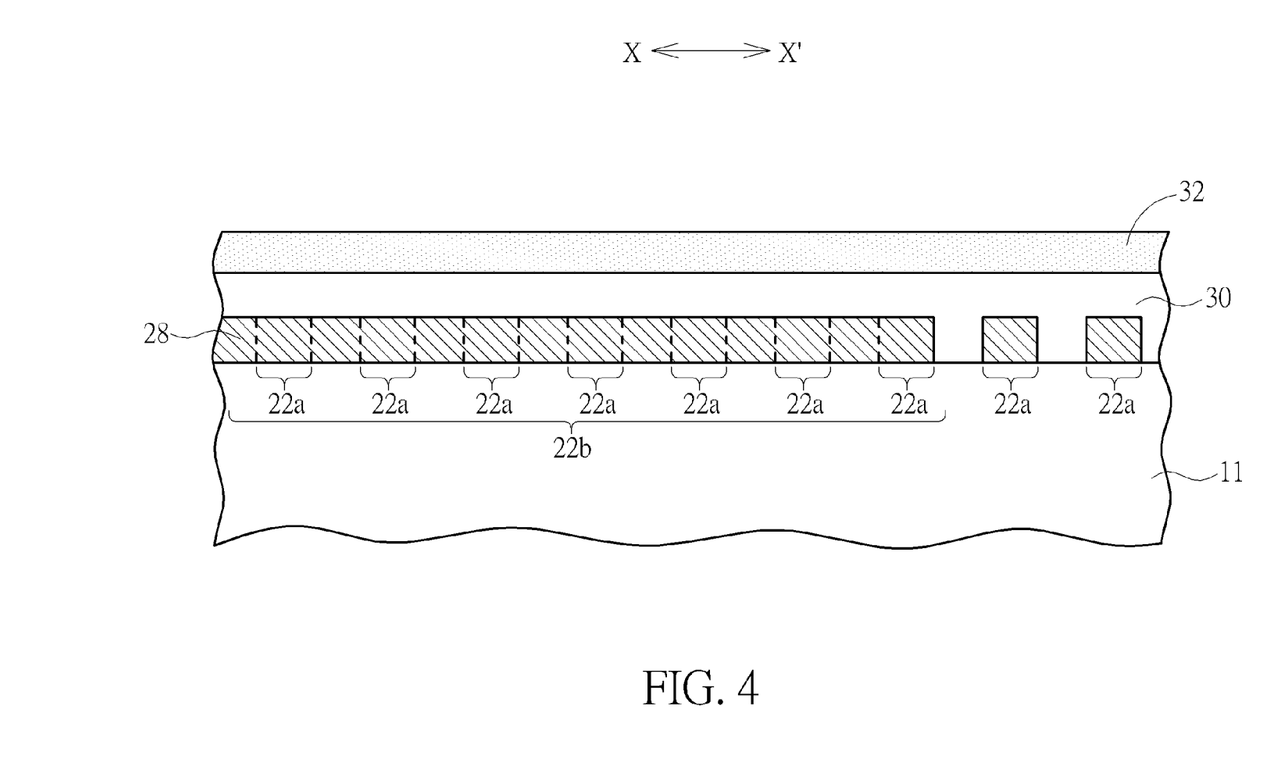
FIG. 4 is a schematic diagram of the cross-sectional view of the adjustment region along the cross-line X-X' shown in FIG. 3.

Referring to FIG. 3 and FIG. 4, FIG. 3 is a partially enlarged schematic diagram of the adjustment area 26 of the display substrate structure 10 according to the first embodiment of the present invention, and FIG. 4 is a schematic diagram of the cross-sectional view of the adjustment area 26 along the cross-line X-X' shown in FIG. 3. In this embodiment, the straight wires 22b and the winding wires 22a are formed with the same conductive layer 28. As a result, each straight wire 22b partially overlaps its corresponding winding wire 22a to share the conductive layer 28. In addition, the conductive layer 28 may compose other parts of the conductive lines 18, such as the fan-out portions 20 not shown in FIG. 3 and FIG. 4. As shown in FIG. 4, the conductive layer 28 which forms the straight wires 22b and the winding wires 22a is disposed on the surface of the substrate 11. The display substrate structure 10 of the present invention may further include a protection layer 30 (or passivation layer) covering the surface of the substrate 11 and the conductive layer 28. When the display substrate structure 10 is applied to a liquid crystal display device, the display substrate structure 10 may also include an alignment layer 32 disposed on the surface of the protection layer 30. In a preferred embodiment, the alignment layer 32 is formed by rubbing alignment material along the Y direction shown in FIG. 1. In addition, for example, in the manufacture of the advanced hyper-viewing angle liquid crystal display, AHVA LCD, the surface of the substrate 11 is brushed by brushes to complete the alignment arrangement, and the process of brushing the surface of the substrate 11 is preferred to rub the substrate 11 along the Y direction in order to improve the problem of rubbing mura in the prior art. In addition, it is noted that the display substrate structure 10 may also include other material layers disposed on the upper side or lower side of the conductive layer 28, which are omitted in FIG. 4.

The display substrate structure of the present invention is not limited to the embodiment described above. Below the other embodiments and their variations of the present invention will be described. However, to simplify the explanation and to highlight the differences among the embodiments and their variations, the same numerals will be used for the same components, and the identical features will not be redundantly described in the following description.

Figure 5:
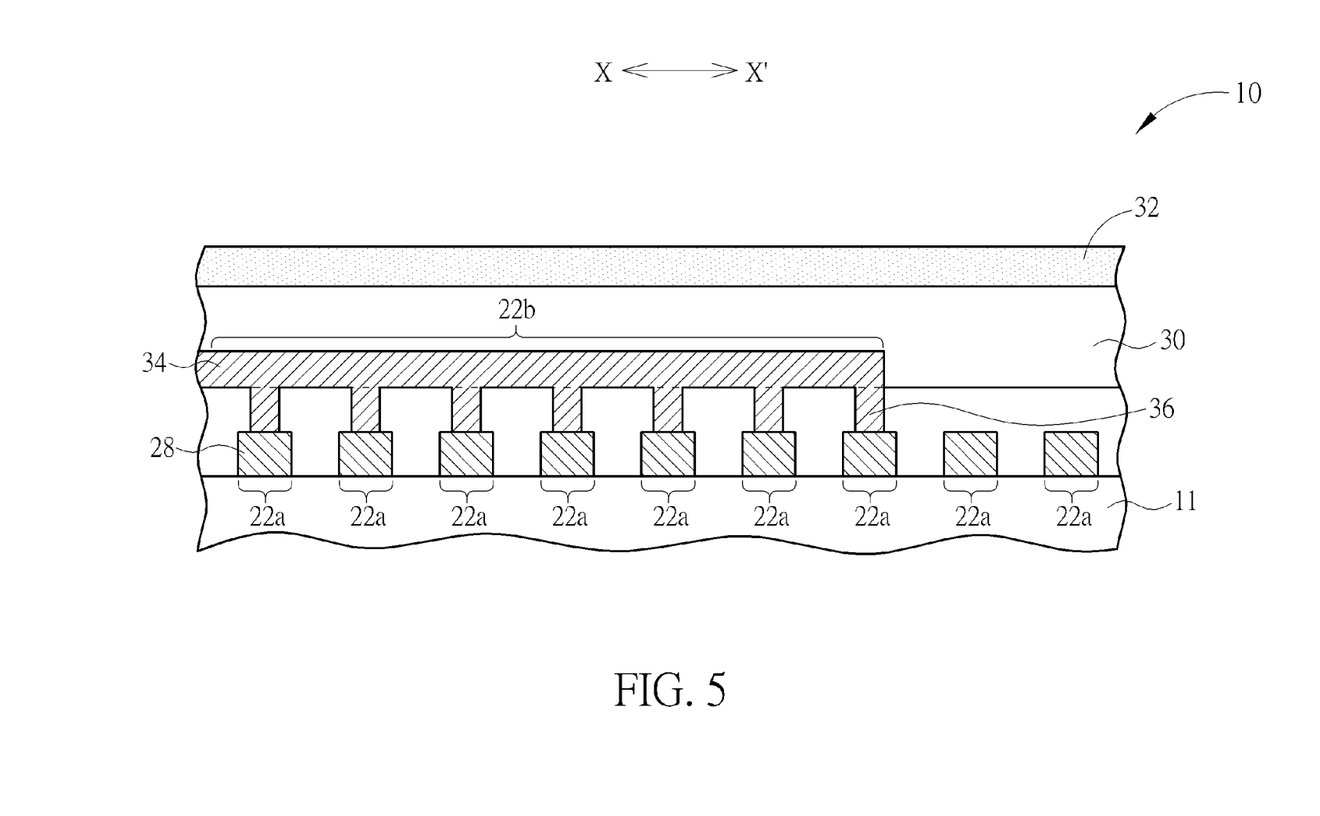
FIG. 5 is a schematic diagram of the partial cross-sectional view of a display substrate structure according to the second embodiment of the present invention.

Referring to FIG. 5, FIG. 5 is a schematic diagram of the partial cross-sectional view of a display substrate structure according to the second embodiment of the present invention. Wherein, the part illustrated in FIG. 5 is corresponding to the cross-section along the cross-line X-X' shown in FIG. 3. In this embodiment, the straight wires 22b and the winding wires 22a are formed with different conductive layers. For example, the straight wire 22b shown in FIG. 5 is disposed on the top side of the winding wire 22a. The winding wire 22a is composed of the conductive layer 28, while the straight wire 22b is composed of the conductive layer 34. In addition, the display substrate structure 10 further includes at least one contact element 36 disposed between the straight wire 22b and the winding wire 22a of the same conductive line 18 for electrically connecting the straight wire 22b and the winding wire 22a of the same conductive line 18. In this embodiment, the display substrate structure 10 includes a plurality of contact elements 36 respectively deposed on the portion where the straight wire 22b and the winding wire 22a overlap to each other, such as the part marked by the arrow and dashed circle in FIG. 3. However, in other variant embodiments, not all the overlap portions of the straight wire 22b and the winding wire 22a have the contact elements 36 disposed thereon, so the number of the contact elements 36 maybe less than the number of the overlap portions of the straight wire 22b and the winding wire 22a. Furthermore, in other embodiments, the straight wires 22b may be disposed under the winding wires 22a, wherein both of them are formed with different conductive layers, which will not be redundantly introduced.

Figure 6:
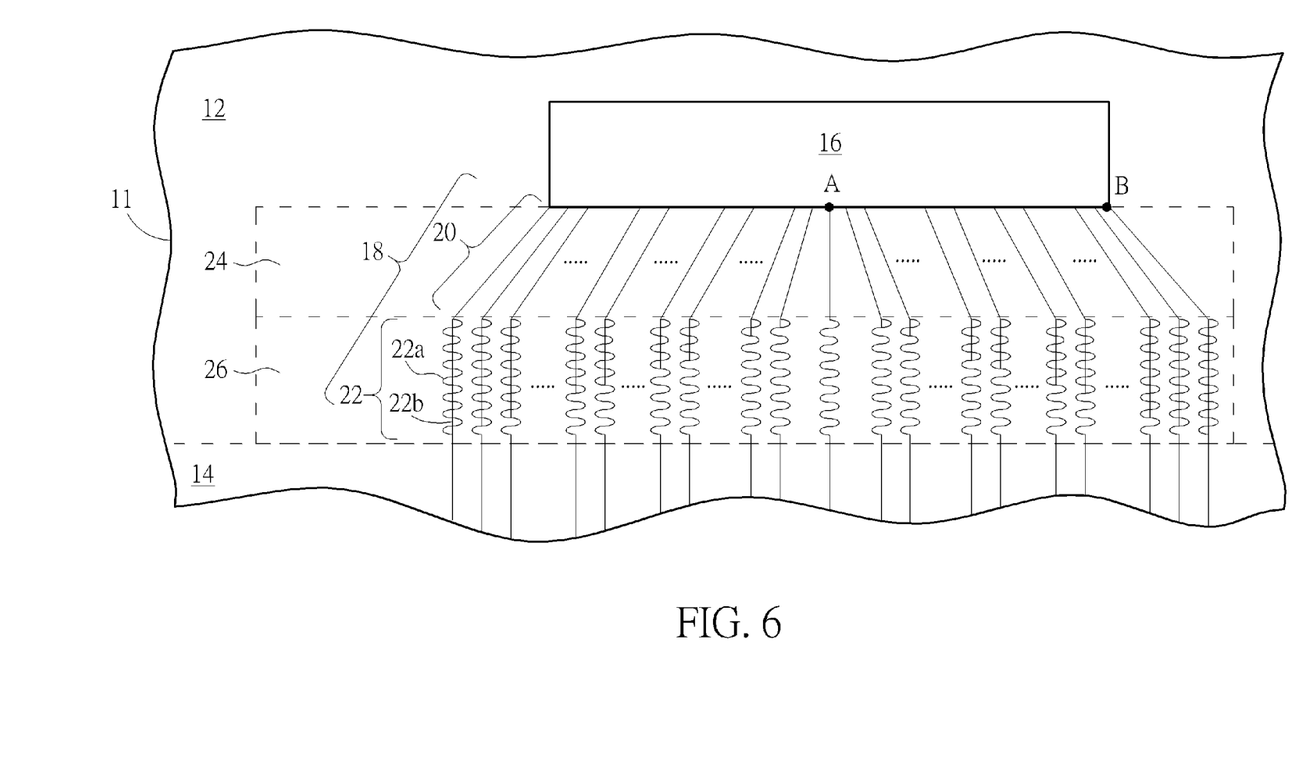
FIG. 6 is a partially enlarged schematic diagram of a display substrate structure according to the third embodiment of the present invention.

Referring to FIG. 6, FIG. 6 is a partially enlarged schematic diagram of a display substrate structure according to the third embodiment of the present invention. This embodiment is different from the first embodiment in that the winding wires 22a have the pattern with evenly and continuously arranged S shapes or wave shapes, while the arrangement of the straight wires 22b are similar to the first embodiment. The closer the straight wires 22b to the outer side of the chip 16 are, the longer their lengths are. And the conductive lines 18 close to the center of the chip 16 may have no straight wire 22b, but not limited thereto. In addition, in other embodiments, the winding wires 22a may have more than one pattern.

Figure 7:
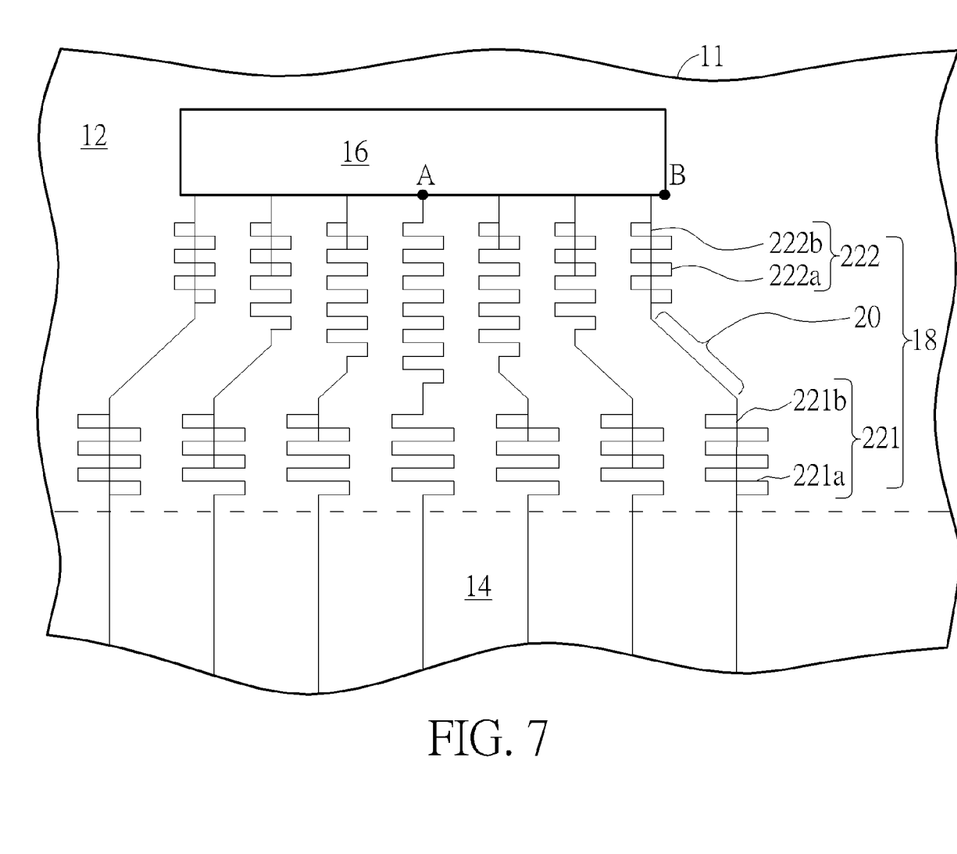
FIG. 7 is a partially enlarged schematic diagram of a display substrate structure according to the fourth embodiment of the present invention.

Referring to FIG. 7, FIG. 7 is a partially enlarged schematic diagram of a display substrate structure according to the fourth embodiment of the present invention. In this embodiment, every conductive line 18 includes two adjustment portions, such as the first adjustment portion 221 and the second adjustment portions 222 shown in FIG. 7. They are respectively disposed at two ends of the fan-out portion 20 of the same conductive line 18. Furthermore, the first adjustment portion 221 is disposed between the fan-out portion 20 of the same conductive line 18 and the display region 14 and is connected to the display region 14, while the second adjustment portion 222 is disposed between the fan-out portion 20 of the same conductive line 18 and the chip 16 and is connected to the chip 16. The first adjustment portions 221 respectively include winding wires 221a, wherein the winding wires 221a in this embodiment substantially have the same lengths. Some of the first adjustment portions 221a also include straight wires 221b. The closer the conductive line 18 to the outer side of the chip 16 is, the longer its straight wire 221b is. Similarly, the second adjustment portions 222 respectively include winding wires 222a. The second adjustment portions 222 of some conductive lines 18 also include straight wires 222b. The closer the conductive wire 18 is to the outer side of the chip 16, the longer its straight wire 222b is. The adjustment portion 222 of the conductive line 18 at the first datum point A may have no straight wire 222b, but not limited thereto. It is noted that the lengths of the second adjustment portions 222 may be different, such that the lengths of the winding wires 222a are not completely the same. In this embodiment, the winding wire 222a closer to the outer side of the chip 16, such as the second datum point B, is shorter, and the winding wire 222a closer to the center of the chip 16, such as the first datum point A, is longer, but not limited thereto.

From the above, the adjustment portions of the present invention display substrate structure have the winding wires with the same patterns to prevent the damage to the display effectiveness caused by the huge differences of the winding patterns in the prior art. Also, the present invention provides adjustment portions further having straight wire with not completely the same lengths. By designing the patterns that the straight wire passes through the corresponding winding wire and by electrically connecting the straight wire with the winding wire, the resistance of the conductive line can be reduced to uniform the entire resistance of each conductive line and also to maintain the display effectiveness and uniform the signal transmission of the display device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display substrate structure, comprising:
a substrate, having a display region and a peripheral region defined thereon, the peripheral region being disposed around the display region;
at least one chip, disposed in the peripheral region; and
a plurality of conductive lines, disposed at least in the peripheral region and at least between the chip and the display region, each of the conductive lines including a fan-out portion and at least one adjustment portion electrically connected to the fan-out portion of the same conductive line, the adjustment portion of each of the conductive lines having a winding wire, and at least one of the adjustment portions of the conductive lines further having a straight wire, wherein the straight wire and the winding wire of the same conductive line at least partially overlap each other and are electrically connected to each other.

2. The display substrate structure of claim 1, wherein at least one of the adjustment portions of the conductive lines do not have the straight wire.

3. The display substrate structure of claim 1, wherein the adjustment portions of at least two of the conductive lines respectively have straight wires, and at least two of the straight wires of the conductive lines having both the winding wires and the straight wires have different lengths.

4. The display substrate structure of claim 3, wherein the resistances of the fan-out portions of the conductive lines are not completely the same, and the length of the straight wire of one of the conductive lines whose fan-out portion has relatively high resistance is longer than the length of the straight wire of another one of the conductive lines whose fan-out portion has relatively low resistance.

5. The display substrate structure of claim 4, wherein the fan-out portions of the conductive lines are arranged as a fan-out shape, and the longer fan-out portion has a greater resistance than the resistance of the shorter fan-out portion.

6. The display substrate structure of claim 3, wherein the chip has a first datum point and a second datum point, at least some of the conductive lines are arranged from the first datum point to the second datum point in order, wherein the fan-out portion of the conductive line closer to the second datum point has a greater resistance than that of the fan-out portion of the conductive line farther to the second datum point, and the straight wire of the conductive line closer to the second datum point is longer than the straight wire of the conductive line farther to the second datum.

7. The display substrate structure of claim 1, wherein the straight wires and the winding wires are composed of the same conductive layer.

8. The display substrate structure of claim 1, wherein the straight wires and the winding wires are composed of different conductive layers.

9. The display substrate structure of claim 8, further comprising a plurality of contact elements respectively disposed between the straight wire and the winding wire of the same conductive line to electrically connect the straight wire and the winding wire of the same conductive line.

10. The display substrate structure of claim 1, wherein the winding wires of the conduct wires have completely the same patterns.

11. The display substrate structure of claim 10, wherein each of the winding wires has a pattern including S shapes or saw-toothed shapes which continuously and evenly arranged.

12. The display substrate structure of claim 1, wherein the conductive lines substantially extend from the chip to the display region along a direction, the display substrate structure further comprises an alignment layer disposed on the conductive lines, and the alignment layer is formed by rubbing an alignment material on the substrate along the same direction.

13. The display substrate structure of claim 1, wherein the adjustment portion of each of the conductive lines is disposed between the fan-out portion of the same conductive line and the display region and is connected to the display region.

14. The display substrate structure of claim 1, wherein each of the conductive lines includes two adjustment portions respectively disposed at two ends of the fan-out portion of the same conductive line.

15. The display substrate structure of claim 1, wherein the lengths of the winding wires of the adjustment portions are not completely the same.

* * * * *